United States Patent

Koyanagi et al.

[11] Patent Number: 6,005,291
[45] Date of Patent: Dec. 21, 1999

[54] SEMICONDUCTOR DEVICE AND PROCESS FOR PRODUCTION THEREOF

[75] Inventors: Kenichi Koyanagi; Kunihiro Fujii; Tatsuya Usami; Koji Kishimoto, all of Tokyo, Japan

[73] Assignee: NEC Corporation, Tokyo, Japan

[21] Appl. No.: 09/138,011

[22] Filed: Aug. 21, 1998

[30] Foreign Application Priority Data

Aug. 22, 1997 [JP] Japan ................................. 9-226669

[51] Int. Cl.$^6$ ................ H01L 23/48; H01L 23/52; H01L 29/40

[52] U.S. Cl. ................... 257/751; 257/763; 257/764; 257/758; 257/753; 257/750

[58] Field of Search ................... 257/751, 763, 257/764, 758, 753, 750

[56] References Cited

U.S. PATENT DOCUMENTS

| | | | |
|---|---|---|---|
| 5,523,626 | 6/1996 | Hayashi et al. | 257/763 |
| 5,866,484 | 2/1999 | Muto | 438/738 |
| 5,874,779 | 2/1999 | Matsuno | 257/758 |

FOREIGN PATENT DOCUMENTS

| | | |
|---|---|---|
| 6-318594 | 11/1994 | Japan . |
| 8-288390 | 1/1996 | Japan . |
| 8-321547 | 12/1996 | Japan . |

OTHER PUBLICATIONS

Hayasaka, et al., Extended Abstracts of the 1995 International Conference on Solid State Devices and Materials, "Fluorine Doped SiO2 for Low Dielectric Constant Films in Sub–Half Micron ULSI Multilevel Interconnection", 1995, pp. 157–159.

*Primary Examiner*—Mahshid Saadat
*Assistant Examiner*—Jhihan B. Clark
*Attorney, Agent, or Firm*—McGinn & Gibb, P.C.

[57] ABSTRACT

A semiconductor device comprising an insulating film at least partially containing a fluorine-containing film, formed above a semiconductor substrate, and a titanium nitride film formed on the insulating film. The above titanium film functions as a barrier metal film for barriering the diffusion of fluorine (F) atoms.

15 Claims, 9 Drawing Sheets

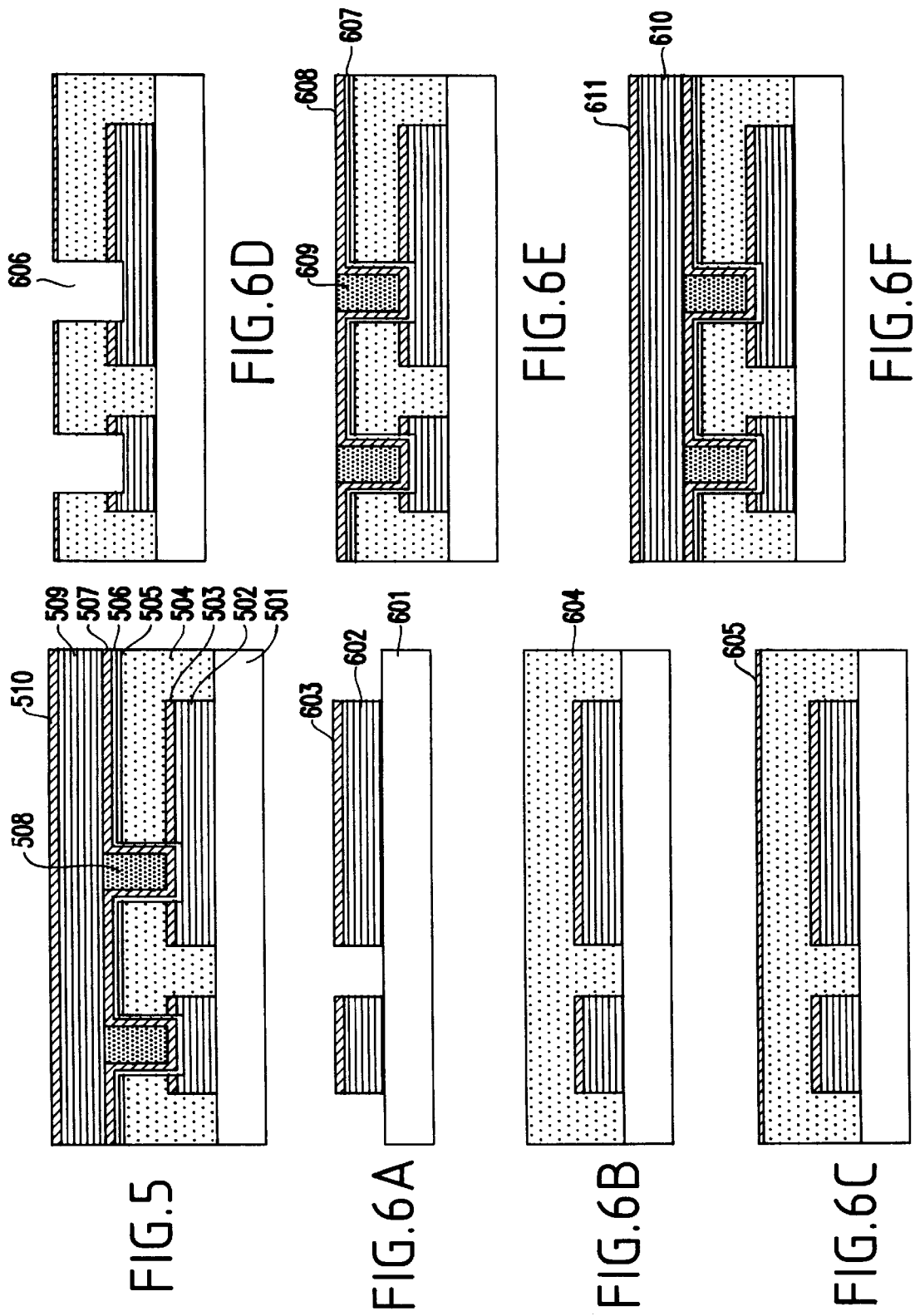

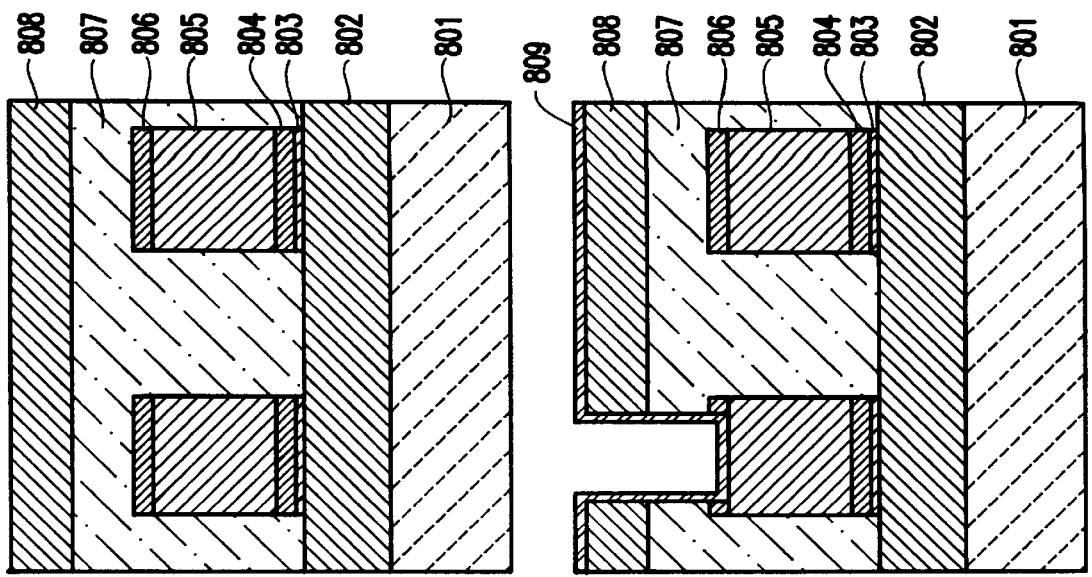
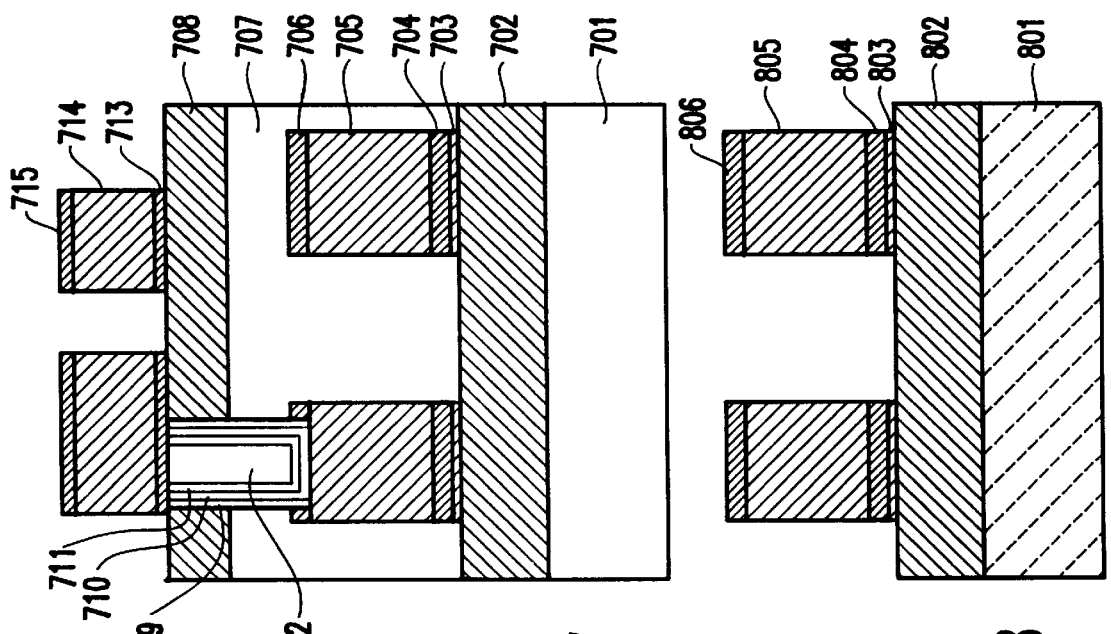

SEMICONDUCTOR DEVICE AND PROCESS FOR PRODUCTION THEREOF

BACKGROUND OF THE INVENTION

1. Field of the Invention

The present invention relates to a semiconductor device having a metal film wiring on an insulating film. More particularly, the present invention relates to a semiconductor device having improved adhesivity between the metal film wiring and the insulating film, and to a process for production of such a semiconductor device.

2. Description of the Related Art

As integrated circuits become finer and wiring-to-wiring intervals become a sub-micron level, the capacity between wirings increases sharply; as a result, delay in signal transfer by wiring increases and the operational speed of integrated circuit is affected adversely. Therefore, it has become necessary to reduce the capacity between wirings.

As the insulating film between wirings, a silicon oxide film ($SiO_2$ film) has been used heretofore. The silicon oxide film has a dielectric constant of about 4.2 to 5.0. For reducing the dielectric constant to lower the capacity between wirings, a method is known which comprises adding fluorine (F) to a silicon oxide film to form a Si-F bond-containing insulating film (see, for example, Extended Abstracts of the 1995 International Conference on Solid State Devices and Materials, 1995, pp. 157–159, "Fluorine Doped $SiO_2$ for Low Dielectric Constant Films in Sub-Half Micron ULSI Multilevel Interconnection"). The Si-F bond-containing insulating film has a dielectric constant of 3.0 to 3.6 which is lower by about 15 to 40% than that of the silicon oxide film.

The Si-F bond-containing insulating film, however, has poor adhesivity to a titanium (Ti) wiring layer, and the wiring layer is peeled. This problem is described below referring to accompanying drawings.

FIG. 15(a) to FIG. 15(c) are sectional views showing the steps of a process for producing a semiconductor device wherein two wiring layers are formed at the surface and a tungsten plug is formed in the contact hole. As shown in FIG. 15(a), on a substrate 1001 on which transistors, etc. have been formed, is formed a silicon oxide film 1002 as an insulating film; then, a titanium film 1003a, a titanium nitride film 1003b, an aluminum-containing metal film 1003c and a titanium nitride film 1003d are formed in this order, and dry etching is conducted to form a first wiring 1003 in a given pattern. Thereafter, an interlayer insulating film 1004 consisting of a Si-F bond-containing silicon oxide film is formed by high-density plasma CVD, after which part of the interlayer insulating layer 1004 and part of the titanium nitride film 1003d (which is the uppermost layer of the first wiring 1003) are selectively removed by dry etching to form a contact hole 1005 reaching part of the first wiring 1003.

Next, as shown in FIG. 15(b), a titanium film 1007a and a titanium nitride film 1007b are formed in this order; then, the substrate is heated to about 450° C. and a tungsten film 1006a is formed by blanket tungsten CVD to fill the contact hole 1005 and cover the interlayer insulating film 1004. The titanium film 1007a and the titanium nitride film 1007b are used in order to enhance the adhesivity of the tungsten formed above the interlayer insulating film 1004, even when the interlayer insulating film 1004 is a F-free silicon oxide film. The titanium film 1007a also has a role of decreasing the contact resistance to the aluminum-containing metal film 1003c of the first wiring 1003 at the bottom of the contact hole 1005.

Next, as shown in FIG. 15(c), dry etching is conducted to remove the portion of the tungsten film 1006a above the interlayer insulating film 1004, other than the contact hole 1005, whereby a tungsten plug 1006b is allowed to remain in the contact hole 1005. Then, an aluminum-containing metal film 1007c and a titanium nitride film 1007d are formed in this order, and dry etching is conducted to form a second wiring 1007 in a given pattern.

In this process, however, when a tungsten film 1006a is formed at a substrate temperature of about 450° C., part of the titanium film 1007a and part of the F contained in the interlayer insulating film 1004 react with each other to form a Ti-F compound, deteriorating the adhesivity between the titanium film 1007a and the interlayer insulating film 1004. Further, peeling occurs between the titanium film 1007a and the interlayer insulating film 1004 owing to the stress of the tungsten film 1006a.

A solution to this peeling is disclosed in Japanese Patent Application Kokai (Laid-Open) No. 321547/1996. FIG. 16(a) to FIG. 16(c) are sectional views showing the steps of a process for producing a semiconductor device free from the above peeling.

As shown in FIG. 16(a), on a substrate 1101 on which transistors, etc. have been formed, is formed a silicon oxide film 1101 as an insulating film; then, a titanium film 1103a, a titanium nitride film 1103b and an aluminum-containing metal film 1103c are formed in this order, and dry etching is conducted to form a first wiring 1103 in a given pattern. Thereafter, an interlayer insulating film (consisting of a Si-F bond-containing silicon oxide film) and an interlayer insulating film 1104b (consisting of a F-free silicon oxide film) are formed in this order by high-density plasma CVD to form an interlayer insulating film 1104. Then, dry etching is conducted to selectively remove part of the interlayer insulating film 1104 to form a contact hole 1105 reaching part of the first wiring 1103.

Next, as shown in FIG. 16(b), a tungsten film 1106 is formed only in the contact hole 1105 by selective tungsten CVD. The above-mentioned titanium film 1007a and titanium nitride film 1007b, which are used for enhancing the adhesivity of the tungsten formed above the interlayer insulating film, are not required in this process because the tungsten film 1006 is formed only in the contact hole 1105.

Next, as shown in FIG. 16(c), a titanium film 1107a, a titanium nitride film 1107b and an aluminum-containing metal film 1107c are formed in this order, after which dry etching is conducted to form a second wiring 1107 in a given pattern.

Thus in the semiconductor device produced by the above process, the Si-F bond-containing silicon oxide film and the titanium film make no direct contact with each other; therefore, there takes place no peeling of the metal film wiring. In the process, however, since the tungsten film 1106 is formed directly on the aluminum-containing metal film 1103c, the resistance at the boundary of the two films is large.

Meanwhile, in recent years, in order to make small the resistance of plug in contact hole, it has become important to form the plug with an aluminum alloy having a specific resistance smaller than that of tungsten. Below is described a process for producing a semiconductor device wherein an aluminum-containing metal plug is formed in the contact hole.

FIG. 17(a) to FIG. 17(c) are sectional views showing the steps of a process for producing a semiconductor device wherein a two-layer wiring is formed at the surface and an aluminum-containing metal plug is formed in the contact hole between the two wiring layers.

As shown in FIG. 17(a), on a substrate 1201 on which transistors, etc. have been formed, is formed a silicon oxide film 1202 as an insulating film. Then, a titanium film 1203a, a titanium nitride film 1203b, an aluminum-containing metal film 1203c and a titanium nitride film 1203d are formed in this order, after which dry etching is conducted to form a first wiring 1203 in a given pattern. Next, an interlayer insulating film 1204 consisting of a Si-F bond-containing silicon oxide film is formed by high-density plasma CVD. Thereafter, dry etching is conducted to selectively remove part of the interlayer insulating film 1204 and part of the titanium nitride film 1203d which is the uppermost layer of the first wiring 1203, whereby a contact hole 1205 reaching part of the first wiring 1203 is formed.

Next, as shown in FIG. 17(b), a titanium film 1206a is formed. Then, an aluminum-containing metal film 1206b is formed by sputtering, in a state that the substrate 1201 has been heated to about 450° C., whereby the contact hole 1205 is filled and the interlayer insulating film 1204 is covered by the aluminum-containing metal film 1206b. Here, the titanium film 1206a serves to make easy the filling of the aluminum-containing metal film 1206b in the contact hole 1205.

Next, as shown in FIG. 17(c), a titanium nitride film 1206c is formed, after which dry etching is conducted to form a second wiring 1206 in a give pattern.

In the above process, however, when an aluminum-containing metal film 1206b is formed at a substrate temperature of about 450° C., part of the titanium film 1206a and part of the F contained in the interlayer insulating film 1204 react with each other to form a Ti-F compound; as a result, the adhesivity between the titanium film 1206a and the interlayer insulating film 1204 is deteriorated and peeling takes place at the boundary of the two films.

Thus, in using an aluminum-containing metal plug having a small specific resistance, there is a problem of the above-mentioned peeling.

SUMMARY OF THE INVENTION

The object of the present invention is to provide a semiconductor device of high reliability, free from the above-mentioned peeling of metal film wiring, and a process for production of such a semiconductor device.

The present inventors made a study in order to solve the above-mentioned problem. As a result, the present inventors found out that for solving the problem, it is very effective to form a titanium nitride film on an interlayer insulating film consisting of a fluorine-containing insulating film (the titanium nitride film can act as a barrier metal layer for barriering the diffusion of the fluorine). The present invention has been completed based on this finding.

The above object of the present invention can be achieved by a semiconductor device comprising an insulating film at least partially containing a fluorine-containing film, formed above a semiconductor substrate, and a titanium nitride film formed on the insulating film.

The above object of the present invention can also be achieved by a semiconductor device comprising a titanium film formed above a semiconductor substrate, an insulating film at least partially containing a fluorine-containing film, also formed above the semiconductor substrate, and a titanium nitride film formed between the titanium film and the insulating film.

The above object of the present invention can also be achieved by a semiconductor device comprising a lower wiring, and an upper wiring, via an insulating film at least partially containing a fluorine-containing film, formed above a semiconductor substrate, and further comprising a contacting port for connecting the two wirings, wherein the side and/or the bottom of the contacting port is constituted by a titanium nitride film.

The above object of the present invention can also be achieved by a process for producing a semiconductor device, which comprises a step of forming a first conductive layer above a semiconductor substrate, a step of forming, on the first conductive layer, an insulating film at least partially containing a fluorine-containing film, and a step of forming, on the whole surface, a titanium nitride film.

As described previously, when a titanium film is formed directly on an interlayer insulating film consisting of a Si-F bond-containing silicon oxide film, part of the titanium film and part of the F contained in the interlayer insulating film react with each other in the subsequent heat-treatment step, to form a Ti-F compound; as a result, the adhesivity between the two films is deteriorated and peeling takes place. Meanwhile in the present invention, on an interlayer insulating film consisting of a Si-F bond-containing silicon oxide film is formed a barrier metal layer made of titanium nitride, and thereon is formed a metal film wiring such as titanium film or the like; therefore, no reaction takes place between the metal film wiring such as titanium film or the like and the F, enabling the formation of a highly reliable metal film wiring free from peeling.

In completing the present invention, the present inventors made, for example, the following adhesivity test. On a silicon substrate was formed an interlayer insulating film consisting of a Si-F bond-containing silicon oxide film, by high-density plasma CVD; then, to the resulting material was applied one of the following three operations.

(i) A 40 nm-thick titanium film and a 700 nm-thick aluminum alloy film were formed in this order by sputtering.

(ii) A 25 nm-thick titanium nitride film, a 40 nm-thick titanium film and a 700 nm-thick aluminum alloy film were formed in this order by sputtering.

(iii) A 50 nm-thick titanium nitride film, a 40 nm-thick titanium film and a 700 nm-thick aluminum alloy film were formed in this order by sputtering.

Thus, three samples were prepared. Incidentally, the F concentration in the interlayer insulating film was $3 \times 10^{21}$ atoms per $cm^3$, and the substrate temperature during formation of the aluminum alloy film by sputtering was 450° C. The three samples were subjected to a peeling test for adhesivity evaluation. As a result, the sample (i) gave rise to peeling at the boundary between the titanium film and the interlayer insulating film; however, the samples (ii) and (iii) showed no peeling. The samples (ii) and (iii) were then subjected to a heat treatment of 400° C. and 30 minutes and subjected again to a peeling test; however, no peeling took place.

From the above test, it became clear that the presence of a titanium nitride film, even when the film is as thin as 25 nm, can suppress the diffusion of F from an interlayer insulating film into a titanium film and prevent peeling of metal film.

The above and other objects, features and advantages of the present invention will become apparent from the following description with reference to the accompanying drawings which illustrate preferred embodiments and examples of the present invention.

BRIEF DESCRIPTION OF THE DRAWINGS

FIG. 5 is a sectional view of the third embodiment of the semiconductor device according to the present invention.

FIG. 6(a) to FIG. 6(f) are sectional views of the steps for production of the third embodiment of the present invention.

FIG. 7 to FIG. 13 are sectional views of the steps for production of the fourth embodiment of the present invention.

DESCRIPTION OF THE PREFERRED EMBODIMENTS

[First Embodiment]

Figure 1:
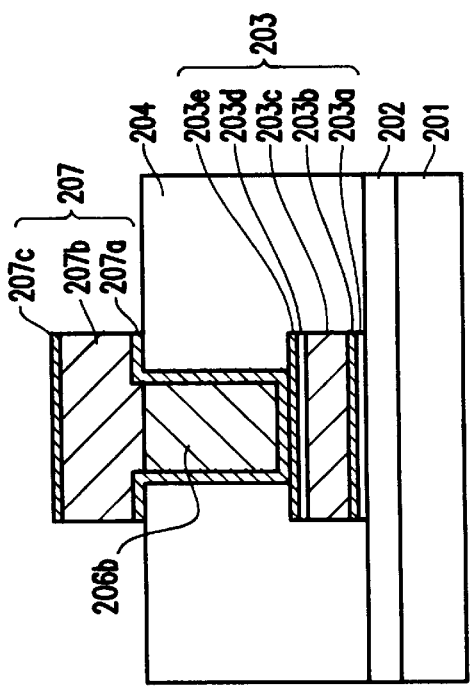
FIG. 1 is a sectional view of the first embodiment of the semiconductor device according to the present invention.

FIG. 1 is a sectional view of the metal wiring portion of the first embodiment of the semiconductor device according to the present invention. In this embodiment, a silicon oxide film 202 is formed on a substrate 201 on which transistors, etc. have been formed; and on part of the film 202 is formed a first wiring 203. This first wiring 203 is a laminated structure consisting of a titanium film 203a, a titanium nitride film 203b, an aluminum-containing metal film 203c, a titanium film 203d and a titanium nitride film 203e.

Thereon is formed an interlayer insulating film 204 consisting of a Si-F bond-containing silicon oxide film. On part of the first wiring 203 is formed a contact hole wiring, i.e. a wiring of laminated structure consisting of a titanium nitride film 207a and a tungsten film 206b. On the interlayer insulating film 204 is formed an electrode. On part of the interlayer insulating film 204 is formed a second wiring 207, and part of the second wiring 207 is connected to the contact hole wiring. The second wiring 207 is a laminated structure consisting of a titanium nitride film 207a, an aluminum-containing metal film 207b and a titanium nitride film 207c.

Figure 2B:
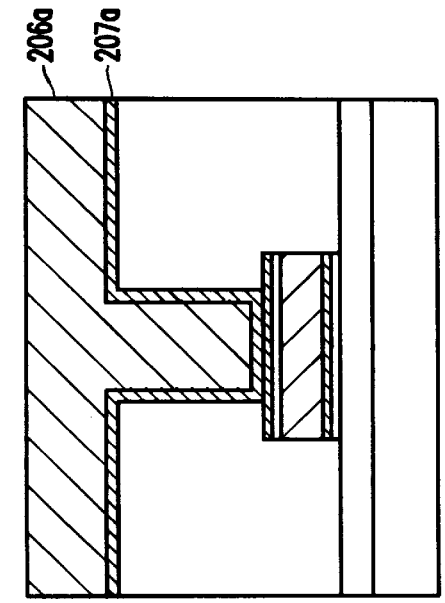
FIG. 2(a) to FIG. 2(c) are sectional views of the steps for production of the first embodiment of the present invention.
Figure 2C:
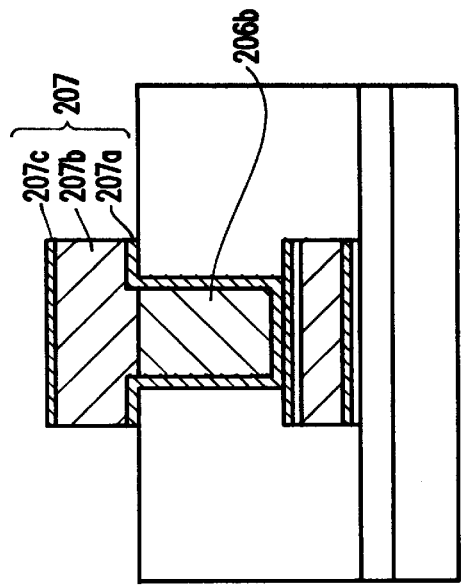
Figure 2A:
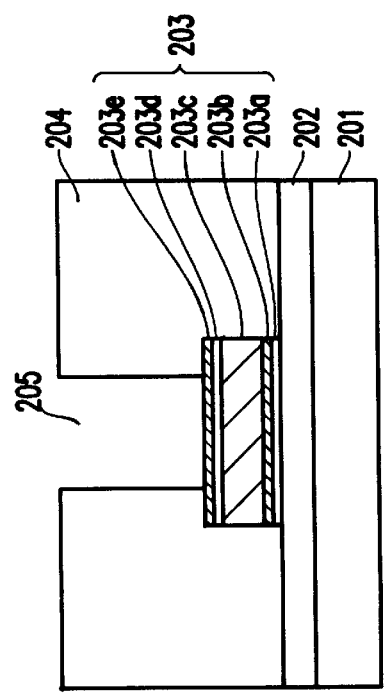

FIG. 2(a) to FIG. 2(c) are sectional views showing the steps for production of the first embodiment of the present invention. As shown in FIG. 2(a), a silicon oxide film 202 as an insulating film is formed on a substrate 201 on which transistors, etc. have been formed. Then, a 30 nm-thick titanium film 203a, a 100 nm-thick titanium nitride film 203b, a 450 nm-thick aluminum-containing metal film 203c, a 25 nm-thick titanium film 203d and a 50 nm-thick titanium nitride film 203e are formed in this order by sputtering, after which dry etching is conducted to form a first wiring 203 in a given pattern.

Next, an interlayer insulating film 204 consisting of a Si-F bond-containing silicon oxide film is formed in a thickness of 1.8 $\mu$m by high-density plasma CVD using $SiF_4$, $SiH_4$, Ar and $O_2$ gases. Then, the interlayer insulating film 204 is levelled by chemical mechanical polishing (CMP). Thereafter, dry etching is conducted to remove part of the interlayer insulating film 204 to form a contact hole 205 reaching part of the first wiring 203. In this case, the titanium nitride film 203e which is the uppermost layer of the first wiring 203, is not etched and is allowed to remain.

Next, as shown in FIG. 2(b), the titanium nitride film 203e at the bottom of the contact hole 205 is etched by a thickness of only 10 nm, by Ar-reverse sputtering; after which a 50 nm-thick titanium nitride film 207a is formed by sputtering. In this case as well, part of the titanium nitride film 203e at the bottom of contact hole 205 is allowed to remain after the Ar-reverse sputtering. Then, the substrate 201 is heated to about 450° C. and blanket tungsten CVD is conducted using $WF_6$, $SiH_4$ and $H_2$ gases, to form a tungsten film 206a, whereby the contact hole 205 is filled and the interlayer insulating film 204 is covered.

Next, as shown in FIG. 2(c), the tungsten film 206a on the interlayer insulating film 204 excluding the tungsten 206a in the contact hole 205 is removed by dry etching, to form a tungsten plug 206b in the contact hole 205. Then, a 450 nm-thick aluminum-containing metal film 207b and a 50 nm-thick titanium nitride film 207c are formed in this order, and dry etching is conducted to form a second wiring 207 in a given pattern.

In this process, the titanium nitride film 203e of the first wiring 203 contacts with the titanium nitride film 207a which is the lowermost layer of the second wiring 207, at the bottom of the contact hole 205. In this case, since the contact is a contact between the films of the same kind, a connection of low resistance and high reliability can be obtained. Further, the titanium film 203d of the first wiring 203 functions so as to prevent the surface of the aluminum-containing metal film 203c from being nitrided and coming to have a higher resistance when the titanium nitride film 203e of the first wiring 203 is formed.

[Second Embodiment]

Figure 3:
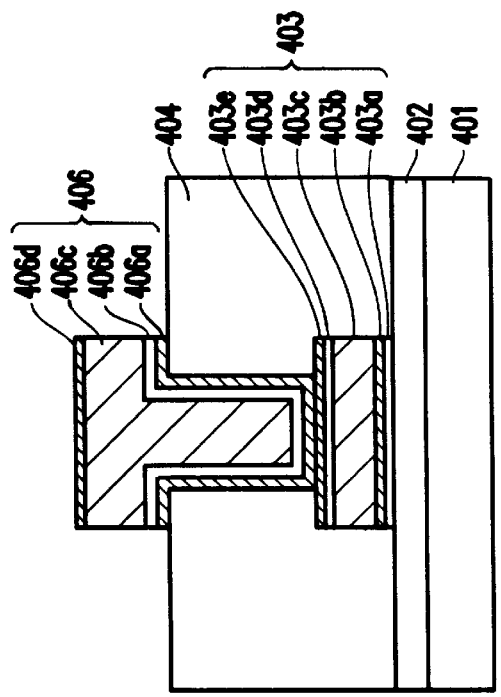
FIG. 3 is a sectional view of the second embodiment of the semiconductor device according to the present invention.

FIG. 3 is a sectional view of the metal wiring portion of the second embodiment of the semiconductor device according to the present invention. In this embodiment, a silicon oxide film 402 is formed on a substrate 401 on which transistors, etc. have been formed; and on part of the silicon oxide film 402 is formed a first wiring 403. This first wiring 403 is a laminated structure consisting of a titanium film 403a, a titanium nitride film 403b, an aluminum-containing metal film 403c, a titanium film 403d and a titanium nitride film 403e.

Thereon is formed an interlayer insulating film 404 consisting of a Si-F bond-containing silicon oxide film. On part of the first wiring 403 is formed, as a wiring in contact hole, a wiring of laminated structure consisting of a titanium nitride film 406a, a titanium film 406b and an aluminum-containing metal 406c. An electrode is formed on the interlayer insulating film 404. On part of the interlayer insulating film 404 is formed a second wiring 406, and part of the second wiring 406 is connected to the wiring in contact hole. The second wiring 406 is a laminated structure consisting of a titanium nitride film 406a, a titanium film 406b, an aluminum-containing metal film 406c and a titanium nitride film 406d.

Figure 4B:
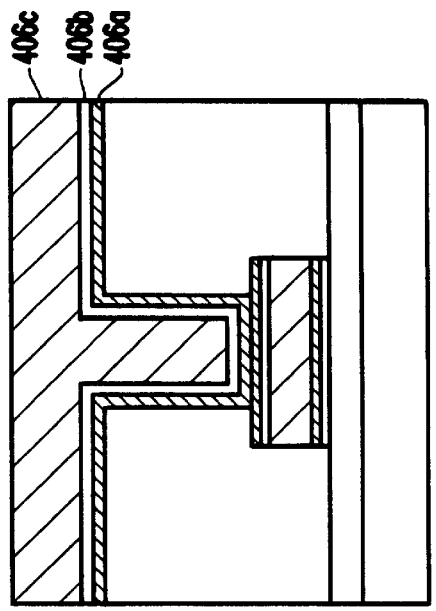
FIG. 4(a) to FIG. 4(c) are sectional views of the steps for production of the second embodiment of the present invention.
Figure 4C:
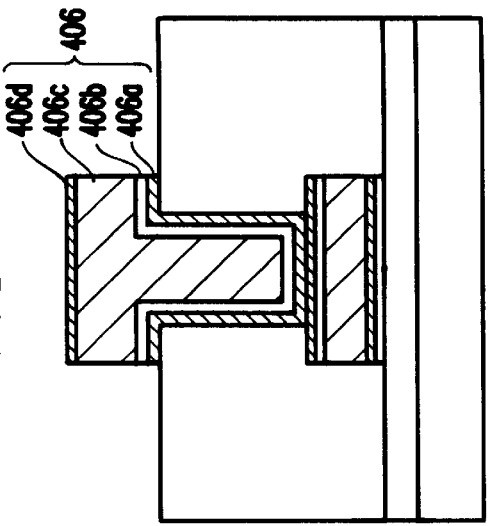
Figure 4A:
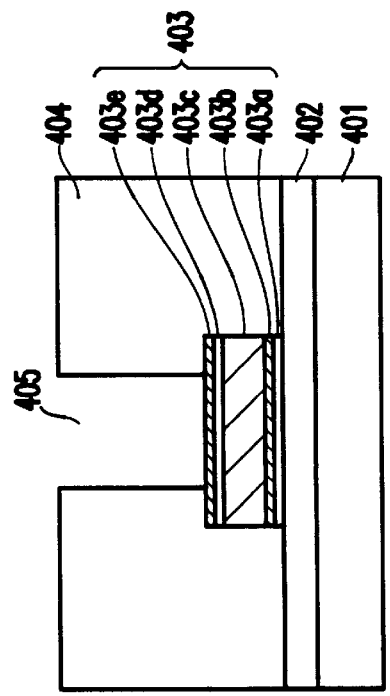

FIG. 4(a) to FIG. 4(c) are sectional views showing the steps for production of the second embodiment of the present invention. As shown in FIG. 4(a), a silicon oxide film 402 as an insulating film is formed on a substrate 401 on which transistors, etc. have been formed. Then, a 30 nm-thick titanium film 403a, a 100 nm-thick titanium nitride film 403b, a 450 nm-thick aluminum-containing metal film 403c, a 25 nm-thick titanium film 403d and a 50 nm-thick titanium nitride film 403e are formed in this order by sputtering, after which dry etching is conducted to form a first wiring 403 in a given pattern.

Next, an interlayer insulating film 404 consisting of a Si-F bond-containing silicon oxide film is formed in a thickness of 1.8 μm by high-density plasma CVD using $SiF_4$, $SiH_4$, Ar and $O_2$ gases. Then, the interlayer insulating film 404 is levelled by CMP. Thereafter, dry etching is conducted to selectively remove part of the interlayer insulating film 404 to form a contact hole 405 reaching part of the first wiring 403. In this case, the titanium nitride film 403e which is the uppermost layer of the first wiring 403, is not etched and is allowed to remain.

Next, as shown in FIG. 4(b), the titanium nitride film 403e at the bottom of the contact hole 405 is etched by a thickness of only 10 nm, by Ar-reverse sputtering; after which a 50 nm-thick titanium nitride film 406a is formed by sputtering. In this case as well, part of the titanium nitride film 403e at the bottom of contact hole 405 is allowed to remain after the Ar-reverse sputtering. Then, a 40 nm-thick titanium film 406b is formed by sputtering, after which a 450 nm-thick aluminum-containing metal film 406c is formed by sputtering, whereby the contact hole 405 is filled and the interlayer insulating film 404 is covered.

As described previously, the titanium film 406b makes easy the filling of the aluminum-containing metal film 406c in the contact hole 405. The formation of the aluminum-containing metal film 406c by sputtering after the formation of the titanium film 406b by sputtering is conducted desirably at high temperatures with a vacuum being maintained, in order to prevent the surface oxidation of the titanium film 406b. The titanium film 406b need not be formed when the contact hole 405 has a small aspect ratio and the filling of the aluminum-containing metal film 406c therein is easy.

Next, as shown in FIG. 4(c), a titanium nitride film 406d is formed and then dry etching is conducted to form a second wiring 406 in a given pattern.

In this process as well, the titanium nitride film 403e of the first wiring 403 contacts with the titanium nitride film 406a of the second wiring 406, at the bottom of the contact hole 405. In this case, since the contact is a contact between the films of the same kind, a connection of low resistance and high reliability can be obtained. Further, the titanium film 403d of the first wiring 403 functions so as to prevent the surface of the aluminum-containing metal film 403c from being nitrided and coming to have a higher resistance when the titanium nitride film 403e of the first wiring 403 is formed.

[Third Embodiment]

FIG. 5 is a sectional view of the metal wiring portion of the third embodiment of the semiconductor device according to the present invention. In this embodiment, a first wiring is formed on a semiconductor substrate 501. The first wiring is a laminated structure consisting of a first aluminum-containing alloy film 502 and a first titanium nitride film 503. On the first wiring is formed a fluorine-containing insulating film 504 as an interlayer insulating film which electrically insulates the first wiring from an upper wiring (a second wiring) described later. As the fluorine-containing insulating film 504, there can be mentioned, for example, a fluorine-containing silicon oxide film and a fluorine-containing carbon-based insulating film. In this embodiment, a fluorine-containing silicon oxide film was used.

On the insulating film 504 is formed a second titanium nitride film 505. Thereon is formed a second wiring. The second wiring is a laminated structure consisting of a first titanium film 506, a third titanium nitride film 507, a second aluminum-containing metal film 509 and a fourth titanium nitride film 510. Further, a contact hole is formed which connects the first wiring and the second wiring, and a tungsten plug 508 is formed in the contact hole. Here, the first titanium film 506 and the third titanium nitride film 507 function as a barrier metal layer for the tungsten plug 508.

FIG. 6(a) to FIG. 6(f) are sectional views showing the steps for production of the third embodiment of the present invention. As shown in FIG. 6(a), on a semiconductor substrate 601 are formed, by sputtering, a first aluminum-containing alloy film 602 and a first titanium nitride film 603. The first titanium nitride film 603 is for prevention of light reflection necessary when a desired wiring pattern is formed later by photolithography. Therefore, other thin film capable of preventing light reflection may be used in place of the first titanium nitride film 603. Thereafter, a desired wiring pattern is formed by photolithography.

Next, as shown in FIG. 6(b), a fluorine-containing silicon oxide film 604 is formed by plasma CVD. As the plasma CVD, there was used high-density plasma CVD which comprised generating a high-density plasma and conducting film formation using the plasma while a RF power was applied to the substrate. Specifically, an inductive coupled plasma was used as a plasma source; a 2 MHz RF of 3,000 W was applied to the plasma source; 1.8 MHz RF of 1,500 W was applied to the substrate; as a film-forming gas, there were introduced 30 sccm of $SiH_4$, 30 sccm of $SiF_4$, 120 sccm of $O_2$ and 30 sccm of Ar. The resulting fluorine-containing silicon oxide film 604 had a thickness of 1.5 μm. In place of the high-density plasma CVD, other method, for example, diode parallel plate plasma enhanced CVD may be used. In this case, a film-forming gas suitable for the other method used must be selected.

After the fluorine-containing silicon oxide film 604 has been formed, the surface thereof is levelled by CMP to complete a fluorine-containing silicon oxide film 604 as an interlayer insulating film. The interlayer insulating film was allowed to have a thickness of 1 μm on the wiring. In place of CMP, other method may be used for levelling.

Next, as shown in FIG. 6(c), a second titanium nitride film 605 having a thickness of 25 nm is formed on the whole surface of the fluorine-containing silicon oxide film 604.

Next, as shown in FIG. 6(d), a desired resist pattern is formed by photolithography. Then, dry etching is conducted to form a contact hole 606 for obtaining an electrical connection between the lower wiring and the upper wiring. In this embodiment, the second titanium nitride film 605 (which is the uppermost layer) and the fluorine-containing silicon oxide film 604 were etched under the same conditions; however, it is possible to first etch the second titanium nitride film 605 under a different condition and then etch the silicon oxide film 604 using the second titanium nitride layer 605 as a mask. In forming the contact hole 606, it is preferred that the first titanium nitride film 603 (which is the uppermost layer of the lower wiring) is removed and the first aluminum-containing alloy film 602 is exposed, because a small contact resistance is obtainable. After the contact hole 606 has been formed, the remaining photoresist is removed.

Next, as shown in FIG. 6(e), a first titanium film 607 of 50-nm thickness and a third titanium nitride film 608 of 100-nm thickness are formed as a barrier metal layer for tungsten plug, by sputtering. The first titanium film 607 reduces contact resistance by reducing an oxide film formed on the aluminum-containing metal film 602 exposed at the bottom of the contact hole 606. The third titanium nitride film 608 prevents peeling of tungsten during the formation of tungsten plug (which is conducted later) and also functions as a stopper layer during the whole-surface etching-back (which is conducted after the formation of tungsten plug). Then, a tungsten film is formed on the whole wafer surface by CVD, after which whole-surface etching-back is conducted by dry etching to form a tungsten plug 609 only in the via-hole.

Next, as shown in FIG. 6(f), a second aluminum-containing metal film 610 of 500-nm thickness and a fourth titanium nitride film 611 of 50-nm thickness are formed by sputtering. Then, photolithography is conducted to form a desired wiring pattern.

[Fourth Embodiment]

FIG. 7 is a sectional view of the metal wiring portion of the fourth embodiment of the semiconductor device according to the present invention. In this embodiment, the interlayer insulating film is formed as a first fluorine-containing silicon oxide film 707; and the outermost side of the contact hole is formed as a third titanium nitride film 709; and the uppermost bottom of the contact hole is formed as a second titanium film 710. The plug 712 in the contact hole is constituted by a first tungsten CVD film. 701 to 715 in FIG. 7 correspond respectively to 801 to 815 of FIG. 8 to FIG. 13 described below.

FIG. 8 to FIG. 13 are sectional views showing the steps for production of the fourth embodiment (substantially the same as FIG. 7) of the present invention. As shown in FIG. 8, a first silicon oxide film 802 is formed on a silicon substrate 801. Then, a first titanium film 803 of about 30-nm thickness is formed by sputtering, after which a first titanium nitride film 804 of about 50-nm thickness is formed also by sputtering. Subsequently, a first aluminum-containing metal film 805 of about 500-nm thickness and a second titanium nitride film 806 of about 50-nm thickness are formed in this order. The thus-formed laminated metal film is subjected to fine processing using a chlorine-based gas, to form a first wiring pattern.

Next, as shown in FIG. 9, a fluorine-containing silicon oxide film 807 of about 1400-nm thickness is formed on the whole surface, and CMP is conducted to allow the fluorine-containing silicon oxide film 807 to remain on the first wiring in a thickness of about 700-nm. Then, a second silicon oxide film 808 of about 200-nm thickness is formed.

Next, as shown in FIG. 10, a contact hole is formed using a fluorocarbon type gas (e.g. CHF$_3$ gas), by a photoresist technique. Then, a third titanium nitride film 809 of 50-nm thickness is formed on the whole surface.

Figure 11:
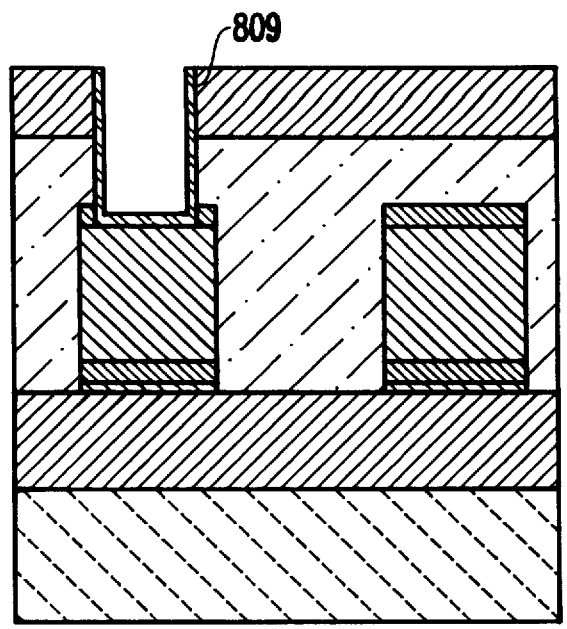

Next, as shown in FIG. 11, the third titanium nitride film 809 is subjected to etching-back using a chlorine-based gas, to allow the third titanium nitride film 809 to remain only at the side of the contact hole, i.e. at the boundary between the contact hole and the first fluorine-containing oxide film 807.

Figure 12:
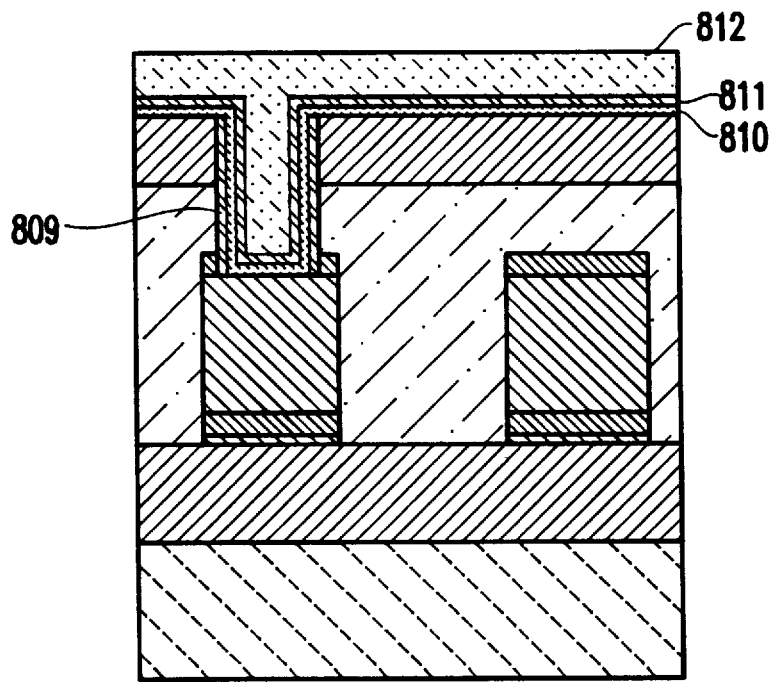

Next, as shown in FIG. 12, a third titanium film 810 of 30-nm thickness is formed on the whole surface. Subsequently, a fourth titanium nitride film 811 of 30-nm thickness is formed on the whole surface. Further, a blanket tungsten CVD film 812 of about 500-nm thickness is formed.

Figure 13:
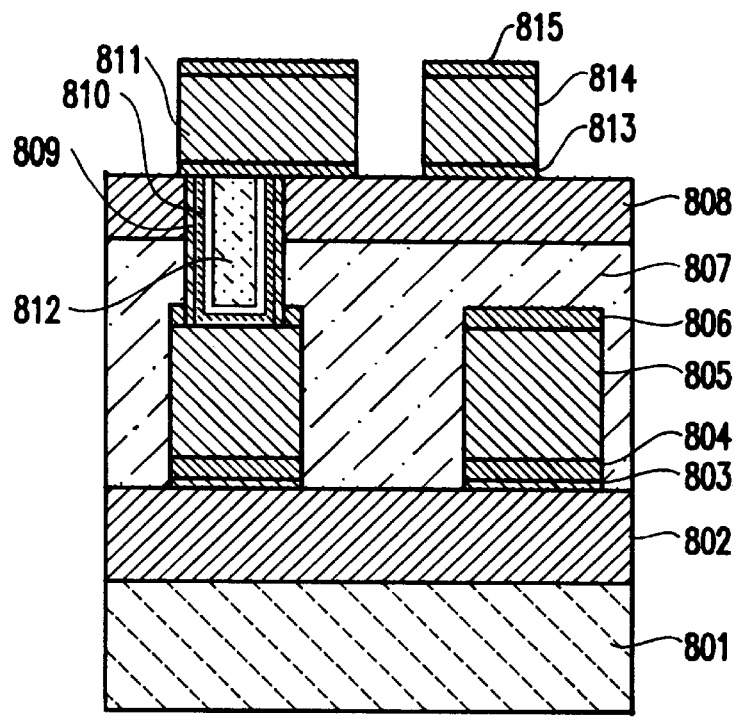

Next, as shown in FIG. 13, etching-back is conducted to remove the portion of the laminated metal films (810, 811 and 812) other than the contact hole. Thereon is formed a fifth titanium nitride film 813 of 50-nm thickness. Then, a second aluminum-containing metal film 814 of about 500-nm thickness is formed, after which a sixth titanium nitride film 815 of 50-nm thickness is formed. These laminated metal films (813, 814 and 815) are processed using a chlorine-based gas by a photoresist technique, to form a second wiring. Thus, a multi-layer wiring is completed.

[Fifth Embodiment]

Figure 14:
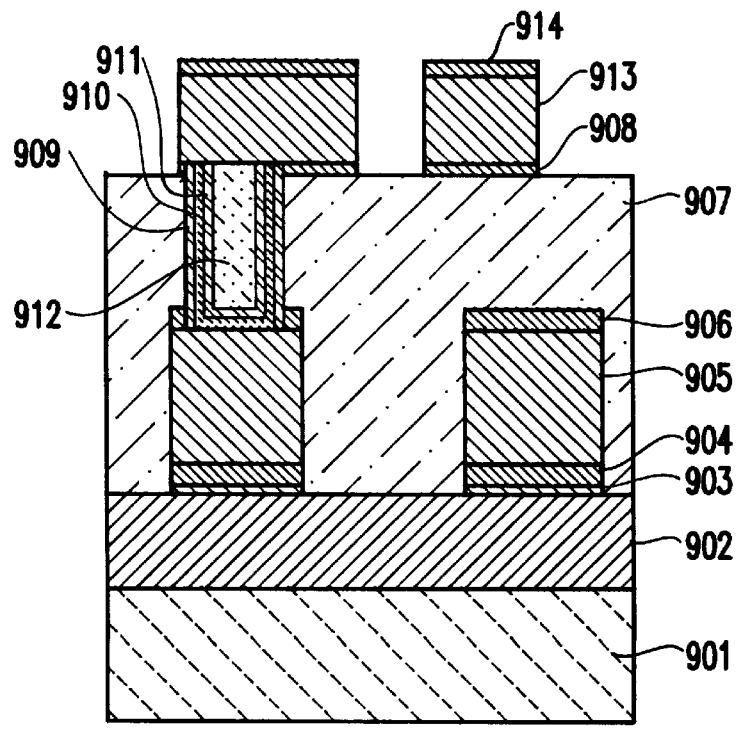
FIG. 14 is a sectional view of the fifth embodiment of the semiconductor device according to the present invention.
Figure 15C:
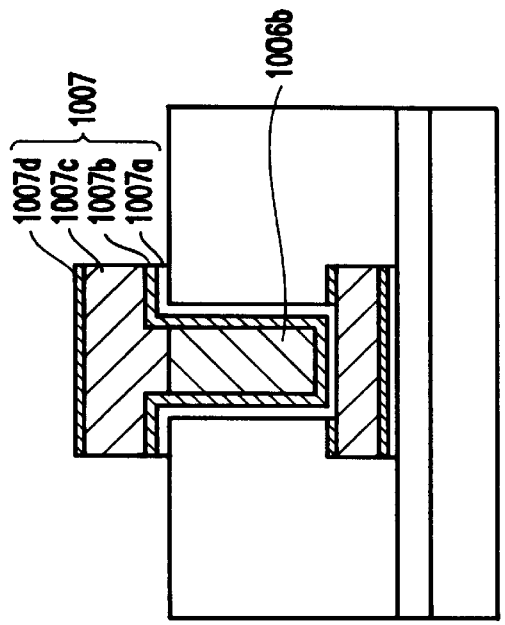
FIG. 15(a) to FIG. 15(c) are drawings for explaining a process for producing a conventional semiconductor device and specifically are sectional views of the steps for forming a tungsten plug in a contact hole.
Figure 15A:
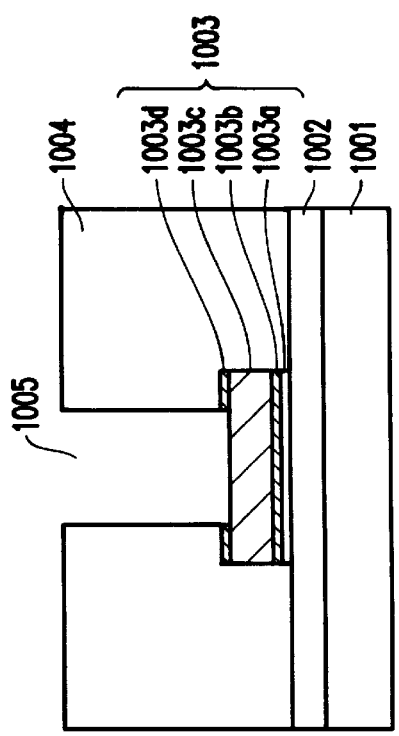
Figure 15B:
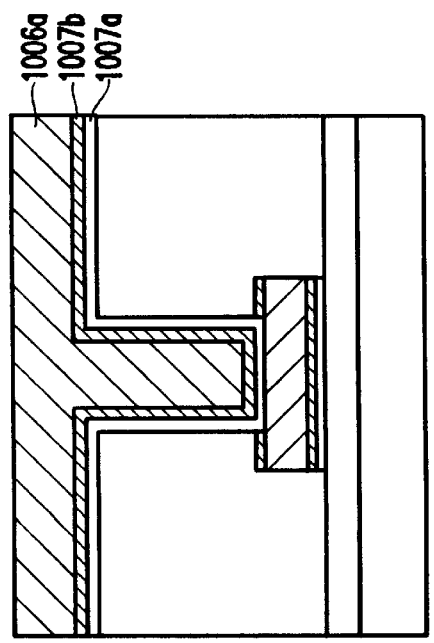
Figure 16A:
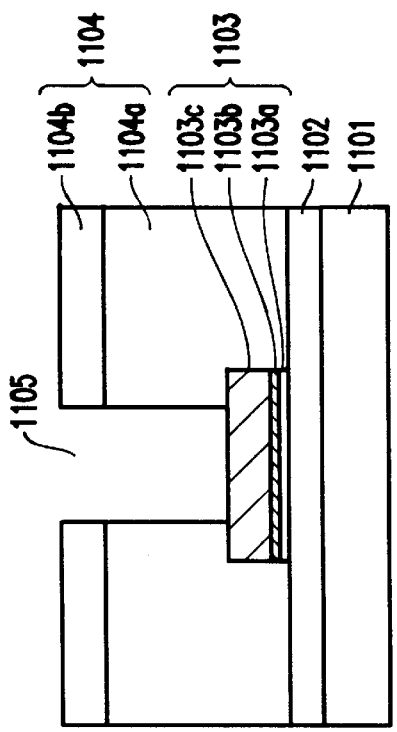
FIG. 16(a) to FIG. 16(c) are drawings for explaining a process for producing a conventional semiconductor device and specifically are sectional views of the improved steps for forming a tungsten plug in a contact hole.
Figure 16B:
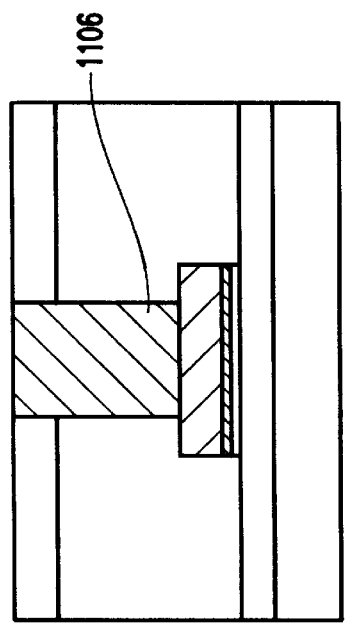
Figure 16C:
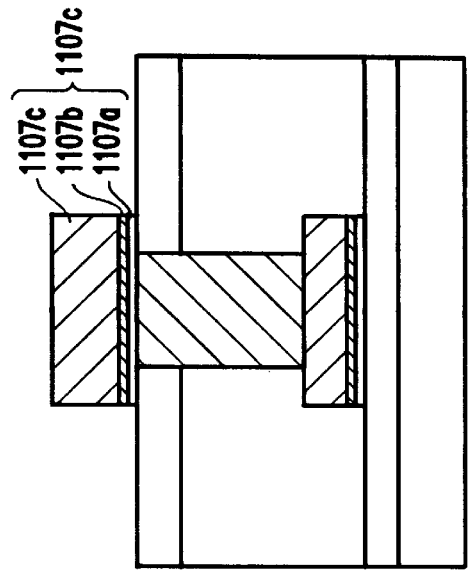
Figure 17C:
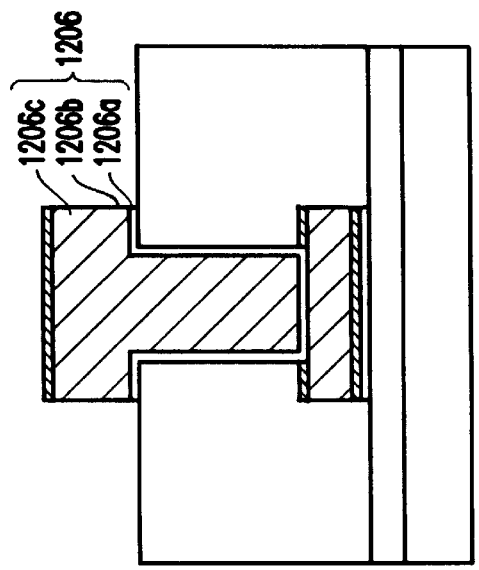
FIG. 17(a) to FIG. 17(c) are drawings for explaining a process for producing a conventional semiconductor device and specifically are sectional views of the steps for forming an aluminum-containing metal plug in a contact hole.
Figure 17A:
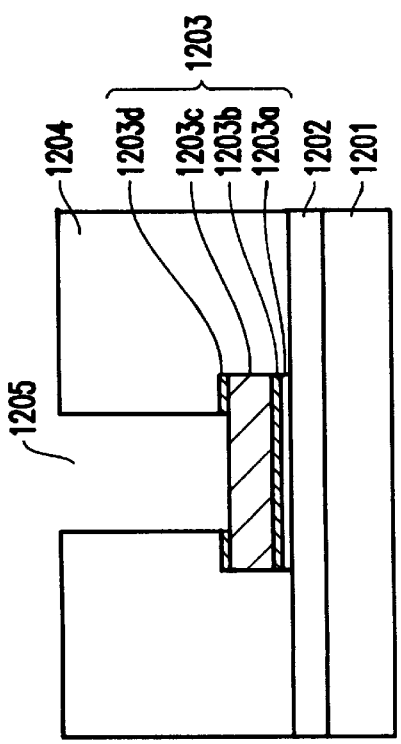
Figure 17B:
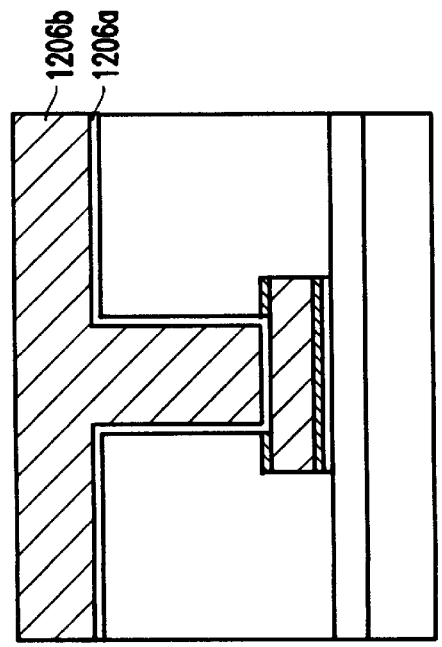

FIG. 14 is a sectional view of the metal wiring portion of the fifth embodiment of the semiconductor device according to the present invention. This embodiment is a combination of the third embodiment and the fourth embodiment. The only difference of the fifth embodiment from the fourth embodiment of FIG. 7 is that the fifth embodiment has no silicon oxide film 708. The fifth embodiment can be produced in the same manner. The advantages of the fifth embodiment over the third and fourth embodiments are that the fifth embodiment is superior to the third embodiment in adhesivity of contacting metal port and to the fourth embodiment in adhesivity of second metal at bottom.

In the first, third, fourth and fifth embodiments, a blanket tungsten film was used as the plug in the contact hole; however, an aluminum-containing metal may be used. Depending upon the material of plug, the structure of the barrier metal layer can be changed. In an aluminum-containing wiring, since there is neither peeling nor problem of stopper during etching-back (these are seen in tungsten), the third titanium film 507, for example, of the third embodiment is not needed. Further, it is possible to form the second aluminum-containing metal film 509 simultaneously with the filling of the contact hole.

As the fluorine-containing insulating film, there can be used, for example, a fluorine-containing silicon oxide film, a fluororesin, a fluorinated polyimide and a fluorinated amorphous carbon. That is, a fluorine-containing silicon oxide film may be substituted by a fluororesin (Teflon film or a fluorinated polyallyl ether), a fluorinated polyimide or a fluorinated amorphous carbon film. In that case, aluminum sputtering of about 450° C. is not used and, instead, blanket aluminum CVD (which enables contact hole filling at a low film formation temperature of 200 to 300° C.) is used desirably.

While preferred embodiments and examples of the present invention have been described using specific terms, such description is for illustrative purpose only, and it is to be understood that changes and variations may be made without departing from the spirit or scope of the following claims.

What is claimed is:

1. A semiconductor device comprising an insulating film at least partially containing a fluorine-containing film, formed above a semiconductor substrate, a titanium nitride film formed on the insulating film, an upper wiring and a lower wiring, wherein an uppermost layer of the lower wiring comprises a first titanium nitride film.

2. A semiconductor device according to claim 1, wherein a lowermost layer of the upper wiring comprises a second titanium nitride film.

3. A semiconductor device according to claim 1, wherein the fluorine-containing film is at least one film selected from the group consisting of a fluorine-containing silicon oxide film, a fluororesin, a fluorinated polyimide and a fluorinated amorphous carbon.

4. A semiconductor device according to claim 1, further comprising a contacting port for connecting the first wiring and the second wiring, wherein sides of the contacting port comprise said first titanium nitride film.

5. A semiconductor device according to claim 1, further comprising a contacting port for connecting said first wiring and said second wiring, wherein a bottom of the contacting port comprises said first titanium nitride film.

6. A semiconductor device comprising a titanium film formed above a semiconductor substrate, an insulating film at least partially containing a fluorine-containing film, also formed above the semiconductor substrate, a lower wiring, an upper wiring, and a titanium nitride film formed between the titanium film and the insulating film, wherein an uppermost layer of the lower wiring comprises a first titanium nitride film.

7. A semiconductor device according to claim 6, wherein the fluorine-containing film is at least one film selected from the group consisting of a fluorine-containing silicon oxide film, a fluororesin, a fluorinated polyimide and a fluorinated amorphous carbon.

8. A semiconductor device according to claim 6, wherein a lowermost layer of the upper wiring comprises a second titanium nitride film.

9. A semiconductor device according to claim 6, further comprising a contacting port for connecting the first wiring and the second wiring, wherein sides of the contacting port comprise a second titanium nitride film.

10. A semiconductor device according to claim 9, wherein a bottom of the contacting port comprises said second titanium nitride film.

11. A semiconductor device comprising: a lower wiring, and an upper wiring, via an insulating film at least partially containing a fluorine-containing film, formed above a semiconductor substrate, and further comprising a contacting port for connecting the two wirings, wherein a bottom of the contacting port comprises a first titanium nitride film.

12. A semiconductor device according to claim 11, wherein sides of the contacting port comprise said second titanium nitride film.

13. A semiconductor device according to claim 11, wherein the fluorine-containing film is at least one film selected from the group consisting of a fluorine-containing silicon oxide film, a fluororesin, a fluorinated polyimide and a fluorinated amorphous carbon.

14. A semiconductor device according to claim 11, wherein an uppermost layer of the lower wiring comprises a second titanium nitride film.

15. A semiconductor device according to claim 11, wherein a lowermost layer of the upper wiring comprises said first titanium nitride film.

* * * * *